US007615809B2

(12) United States Patent
Kobayashi

(10) Patent No.: US 7,615,809 B2
(45) Date of Patent: Nov. 10, 2009

(54) JUNCTION FIELD EFFECT TRANSISTOR AND METHOD OF MANUFACTURING THE SAME

(75) Inventor: Shunsuke Kobayashi, Gunma (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 165 days.

(21) Appl. No.: 11/844,817

(22) Filed: Aug. 24, 2007

(65) Prior Publication Data

US 2008/0048214 A1    Feb. 28, 2008

(30) Foreign Application Priority Data

Aug. 25, 2006  (JP) .............................. 2006-229280

(51) Int. Cl.
*H01L 29/80*   (2006.01)
(52) U.S. Cl. ............... 257/256; 257/270; 257/E29.312; 438/186
(58) Field of Classification Search ................. 257/256, 257/270, E29.312, E21.446; 438/186
See application file for complete search history.

(56) References Cited

U.S. PATENT DOCUMENTS

| 4,333,224 | A  | * | 6/1982 | Buchanan .................... 438/149 |
| 5,510,632 | A  | * | 4/1996 | Brown et al. ................... 257/77 |
| 7,417,270 | B2 | * | 8/2008 | Hower et al. ................. 257/270 |
| 2003/0168704 | A1 |   | 9/2003 | Harada et al. |

FOREIGN PATENT DOCUMENTS

| CN | 1496587 | 5/2004 |
| JP | 6-69244 | 3/1994 |
| JP | 08-227900 | 9/1996 |

\* cited by examiner

*Primary Examiner*—Mark Prenty
(74) *Attorney, Agent, or Firm*—Morrison & Foerster LLP

(57) ABSTRACT

According to a junction FET of the present invention, the depth of a channel region is made shallow by selectively performing ion implantation and diffusion. Since the channel region forms a pn junction together with a p type semiconductor layer with relatively low impurity concentration, the improvement in the high frequency characteristic and the reduction in the amount of the leakage current because of the reduction in a junction capacitance can be achieved. Moreover, the depth of a gate region is also made shallow by ion implantation, and thus the reduction in noise because of the reduction in the internal resistance can be achieved.

10 Claims, 9 Drawing Sheets

Prior Art

Prior Art

JUNCTION FIELD EFFECT TRANSISTOR AND METHOD OF MANUFACTURING THE SAME

BACKGROUND OF THE INVENTION

This invention claims priority from Japanese Patent Application Number JP2006-229280 filed on Aug. 25, 2006, the content of which is incorporated herein its entirety.

1. Field of the Invention

The present invention relates to a junction field effect transistor (junction FET) and a method of manufacturing the junction FET, and particularly to a junction FET in which a high frequency characteristic and a noise figure characteristic thereof are improved, and a method of manufacturing the junction FET.

2. Description of the Related Art

In a conventional junction FET, for example, an n type well region, which serves as a channel region, is formed on a p type semiconductor substrate. In the n type well region, an n+ type source and an n+ type drain regions are formed. Then, a gate region is formed between the source and drain regions. This technology is described, for instance, in Japanese Patent Application Publication No. Hei 08-227900 (p. 2, and FIG. 6).

Description will be given of a conventional junction FET 200 with reference to FIG. 8A and FIG. 8B. FIG. 8A is a plan view showing the conventional junction FET 200. FIG. 8B is a cross-sectional view taken along the line b-b in FIG. 8A.

A p type epitaxial layer 22 is grown on a p type substrate 21, and then an n type epitaxial layer 24' is formed thereon. A p+ type isolation region 23, which reaches the p type substrate 21, is formed to define and surround an n type well region 24, thereby the n type well region 24 comes to be a channel region 24.

An n+ type source region 25 and an n+ type drain region 26 are formed in the surface of the channel region 24. A source electrode 29 and a drain electrode 30 are respectively connected to the source region 25 and the drain region 26 through contact holes formed in an insulating film 40. In addition, a gate region 27 is formed between the source region 25 and the drain region 26.

Description will be given of a method of manufacturing the conventional junction FET 200 with reference to FIGS. 9A to 9D.

Firstly, the p type epitaxial layer 22 and the n type epitaxial layer 24' are stacked on the p type substrate 21. The n type well region 24, which is to serve as the channel region, is isolated from the n type epitaxial layer 24' by forming p+ type isolation region (ISO) 23 (FIG. 9A). An opening is formed in the oxide film 40 at a predetermined position, and a p type impurity is implanted and diffused in the n type well region 24 to form the p+ type gate region 27. The impurity concentration of the p+ type gate region 27 is an order of $10^{18}$ cm$^{-3}$ (FIG. 9B). Thereafter, openings are formed in the oxide film 40 at predetermined positions where the source region 25 and the drain region 26 are to be formed. An n type impurity (for example, phosphorus (P)) is implanted and diffused in the n type well region to form the n+ type source region 25 and the n+ type drain region 26 (FIG. 9C). Furthermore, the source electrode 29 and the drain electrode 30 are formed to come into contact with the source region 25 and the drain region 26, respectively. Then, a gate electrode 31 is formed on the back side of the substrate (FIG. 9D).

It is important for the junction FET employed to an RF (high frequency) amplifier to have a high frequency characteristic. In the conventional junction FET 200, a depth d21 (see FIG. 8B) of the channel region 24 cannot be made shallow. For this reason, when the junction FET 200 is employed to an RF amplifier, the amplifier is generally used in a relatively low-frequency band, for example, 1 MHz.

Here, a cut-off frequency $f_T$ indicating the high frequency characteristic of the junction FET 200 is largely associated with the capacitance of pn junctions formed between the channel region 24 and the p+ type epitaxial layer 22 and between the channel region 24 and the p+ type isolation region 23. The reduction in the pn junction capacitance contributes to the improvement of the cut-off frequency $f_T$.

Incidentally, as shown in FIG. 9, the conventional channel region 24 is isolated from the n type epitaxial layer 24' by the isolation region 23. The n type epitaxial layer 24' can be made as thin as approximately 2 μm in thickness. When the layer is made thinner than this limitation, it is hard to manage the variation in thickness of the epitaxial layer 24' at the time of forming. Accordingly, there is a problem that characteristics of the channel region 24 are varied.

In other words, in the conventional structure, the area of the pn junctions formed between the channel region 24 and the p type epitaxial layer 22 and between the channel region 24 and the p+ type isolation region 23 is restricted by the thickness d21 of the n type epitaxial layer 24' (depth of the channel region 24). As a result, the improvement in the high frequency characteristic of the junction FET 200 by reducing the pn junction capacitance cannot be achieved.

In addition, the improvement in the noise figure characteristic of the junction FET 200 has not been achieved either in the conventional structure. For the improvement in the noise figure characteristic, the reduction in the leakage current and the reduction in the internal resistance at an operation part are required. In the junction FET 200 of the conventional structure, however, generation of the leakage current in the pn junction portions formed between the channel region 24 serving as the operation part and the surrounding p type regions cannot be prevented.

Specifically, in the structure shown in FIG. 8, the channel region 24 is formed by causing the n type epitaxial layer 24' to be isolated from the channel region 24 by having the isolation region (ISO) 23 therebetween. The gate region 27 comes into contact with the isolation region (ISO) 23 formed around the channel region 24, through which the gate region 27 is connected to the gate electrode 31 on the back side of the substrate. In order to reduce the input resistance of the device, the p type isolation region 23 serving as a current path has a high impurity concentration (1E19 cm$^{-3}$ or higher). As a result, there is a large difference in the impurity concentrations between the channel region 24 and the isolation region 23, and the amount of the leakage current produced at the pn junction therebetween is accordingly increased.

Moreover, when the depth d21 of the channel region 24 is large as described above, the reduction in the internal resistance at the operation part is also interfered. An $I_{DSS}$ (or a pinch-off voltage) of the junction FET 200 is determined by the following factors: a depth d22 of the region immediately below the gate region 27 (depth of the portion from the bottom of the gate region 27 to the bottom of the channel region 24); the impurity concentration of the channel region 24; and a width (gate length) w21 of the gate region 27.

In other words, the depth d22 of the region immediately below the gate region 27 is automatically determined when a predetermined $I_{DSS}$ is ensured while keeping the gate length w21 and the impurity concentration of the channel region 24 constant. Thus, the determination of the depth d22 does not depend on the depth d21 of the channel region 24. Accordingly, when the depth d21 of the channel region 24 can not be set to be shallower than a certain depth (2 µm) as in the conventional structure, a depth d23 of the gate region 27 needs to be so large that a predetermined depth can be secured for the depth d22 of the region immediately below the gate region 27.

When the depth d23 of the gate region 27 is large, the length of the signal path which is formed between the source region 25 and the drain region 26 via a region immediately below the gate region 27 increases. Moreover, since the gate region 27 is formed by the diffusion of ions of the impurity, when the depth of the gate region 27 is large, the lateral diffusion therein (diffusion in a horizontal direction of the substrate) also progresses. Accordingly, the reduction in the signal path length cannot be achieved. For these reasons, the internal resistance is increased, and thereby, the noise figure characteristic is deteriorated.

SUMMARY OF THE INVENTION

This invention provides a junction field effect transistor including a semiconductor substrate of a first general conductivity type, a semiconductor layer of the first general conductivity type disposed on the substrate, a channel region of a second general conductivity type, the channel region being formed in a surface portion of the semiconductor layer so that a lateral edge of the channel region forms a pn junction with the semiconductor layer, a source region of the second general conductivity type formed in the channel region, a drain region of the second general conductivity type formed in the channel region, and a gate region of the first general conductivity type formed in the channel region.

The invention also provides including a semiconductor substrate of a first general conductivity type, a semiconductor layer of the first general conductivity type disposed on the substrate, a channel region of a second general conductivity type, the channel region being formed in a surface portion of the semiconductor layer so that a contour of the channel region is within a contour of the semiconductor layer and a lateral edge of the channel region forms a pn junction with the semiconductor layer, a source region of the second general conductivity type formed in the channel region, an impurity concentration of the source region being higher than an impurity concentration of the channel region, a drain region of the second general conductivity type formed in the channel region, an impurity concentration of the drain region being higher than the impurity concentration of the channel region, a gate region of the first general conductivity type formed in the channel region, and a conductive layer disposed on the gate region so as to be in contact with the gate region.

The invention also provides a method of manufacturing a junction field effect transistor. The method includes forming a semiconductor layer of a first general conductivity type on a semiconductor substrate of the first general conductivity type, implanting impurity ions in the semiconductor layer to form a channel region of a second general conductivity type so that a lateral edge of the channel region forms a pn junction with the semiconductor layer, forming a gate region of the first general conductivity type in the channel region, and forming a source region and a drain region that are of the second general conductivity type in the channel region.

The method also includes forming a semiconductor layer of a first general conductivity type on a semiconductor substrate of the first general conductivity type, implanting impurity ions in an isolated area of the semiconductor layer to form a channel region of a second general conductivity type, forming a conductive layer in contact with the channel region, forming a gate region of the first general conductivity type in the channel region, and forming a source region and a drain region that are of the second general conductivity type in the channel region.

DETAILED DESCRIPTION OF THE PREFERRED EMBODIMENTS

Hereinafter, description will be given in detail of a junction FET according to the present invention with reference to FIGS. 1 to 7.

Figure 1A:
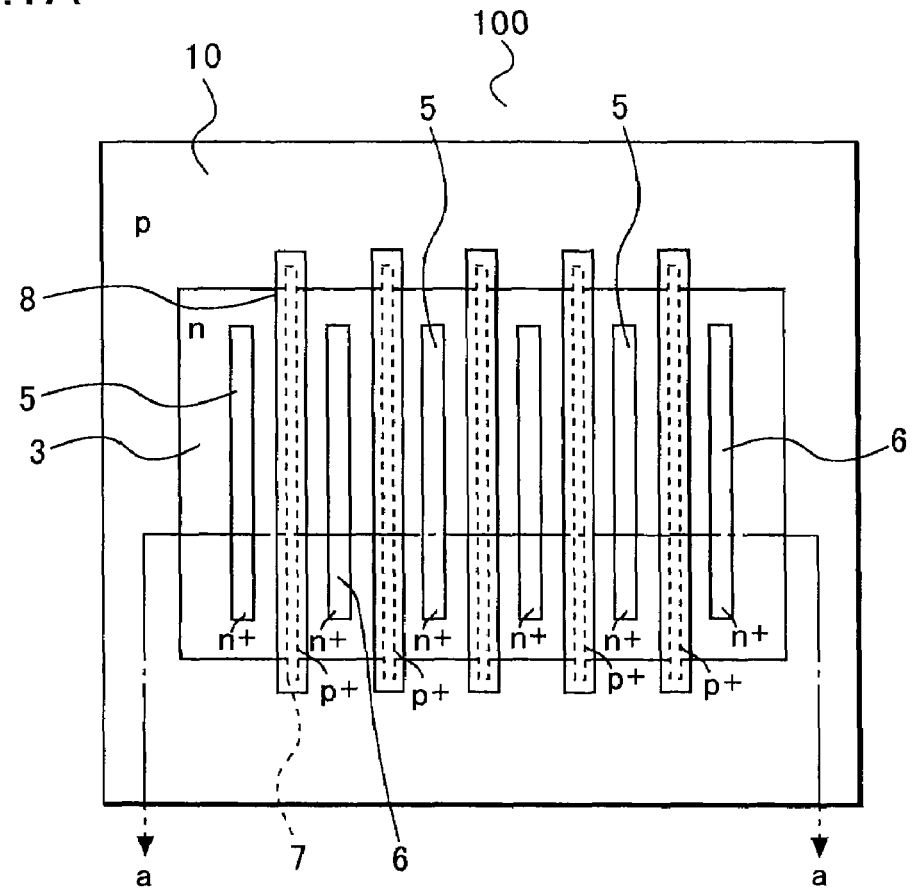
FIG. 1A is a plan view.
Figure 1B:
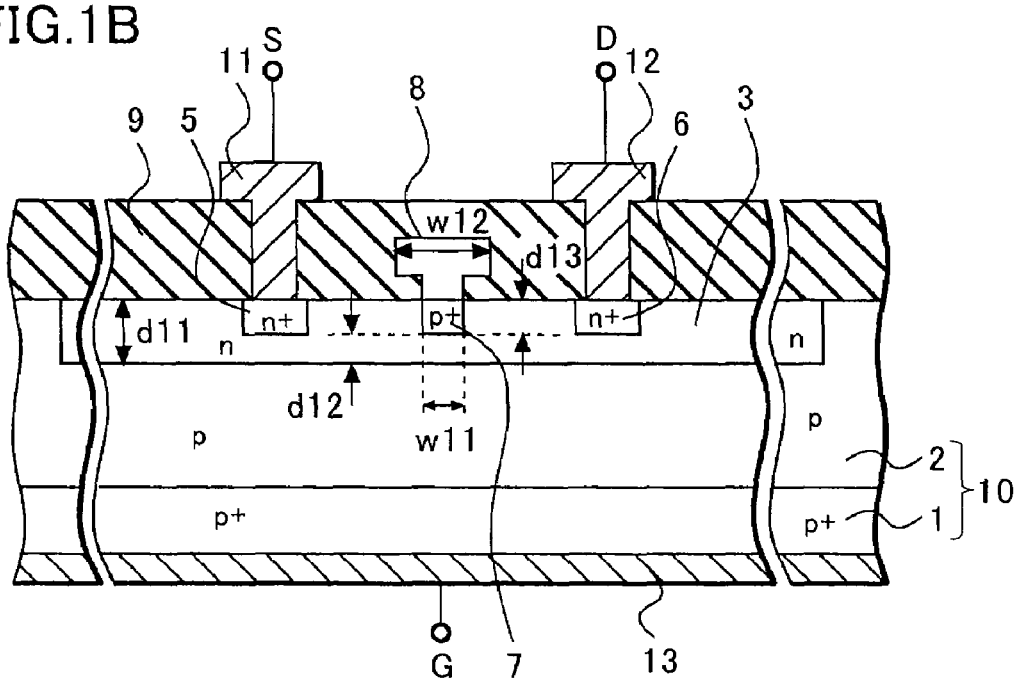
FIG. 1B is a cross-sectional view, for describing a semiconductor device according to an embodiment of the present invention.

FIG. 1A and FIG. 1B are views showing a junction FET 100 according to the present embodiment. FIG. 1A is a plan view, and FIG. 1B is a partial cross-sectional view taken along the line a-a in FIG. 1A. Note that, in FIG. 1A, an insulating film and metal electrodes (a source electrode and a drain electrode) provided on the surface of a substrate are omitted. FIG. 1B shows one cell comprised of a source region, a drain region and a gate region.

The junction FET 100 according to the present invention includes a semiconductor substrate 1, a semiconductor layer 2, a channel region 3, a source region 5, a drain region 6, a gate region 7 and a conductive layer 8.

As shown in FIG. 1A, the n type channel region 3 is formed in the surface of a p type semiconductor substrate 10. The p type gate regions (shown by chain lines) 7, the n type source regions 5 and the n type drain regions 6 are provided, forming stripes, in the surface of the channel region 3. The conductive layers 8 are formed on the gate regions 7 so that the conductive layers 8 overlap the gate regions 7, respectively, and thus, the conductive layers 8 come in contact with the gate regions 7.

It is noted that conductivity types such as n+, n and n− belong in one general conductivity type, and conductivity types such as p+, p and p− belong in another general conductivity type.

As shown in FIG. 1B, the p type semiconductor substrate 10 is formed by stacking the p type semiconductor layer 2 on the p type silicon semiconductor substrate (hereinafter, referred to simply as p+ type semiconductor substrate) 1, for example, by epitaxial growth. The impurity concentration of the p type semiconductor layer 2 is approximately 1.46E16 cm$^{-3}$. The channel region 3 is an impurity region which is formed into an island shape by selectively performing ion implantation and diffusion of an n type impurity on the surface of the p type semiconductor layer 2. The impurity concentration of the channel region 3 is approximately 4.5E16 cm$^{-3}$. The depth d11 of the channel region 3 from the surface of the p type semiconductor layer 2 is approximately 0.8 μm to 1.5 μm (for example, 0.9 μm). The side surfaces and bottom surface of the n type channel region 3 form pn junctions together with the p type semiconductor layer 2.

The source region 5 and the drain region 6 are formed by implanting and diffusing n type impurities in the surface of the channel region 3. An insulating film 9 is formed on the surface of the substrate 10, and a source electrode 11 and a drain electrode 12 are each formed into a comb shape in a plane pattern(see FIG. 2). The source electrode 11 and the drain electrode 12 come into contact with the source region 5 and the drain region 6, respectively, through contact holes formed in the insulating film 9.

The gate region 7 is a p type impurity diffusion region formed between the source region 5 and the drain region 6 in the channel region 3. The impurity concentration of the gate region 7 is preferably approximately 1E18 cm$^{-3}$. A depth d13 of the gate region 7 is approximately equal to that of the source region 5 and that of the drain region 6, and specifically the depth d13 is approximately 0.1 μm to 0.2 μm from the surface of the channel region 3.

One cell of the junction FET 100 comprises the one set of the source region 5, the drain region 6 and the gate region 7 shown in FIG. 1B, and multiple cells are disposed in the one channel region 3 as shown in FIG. 1A.

Figure 8A:
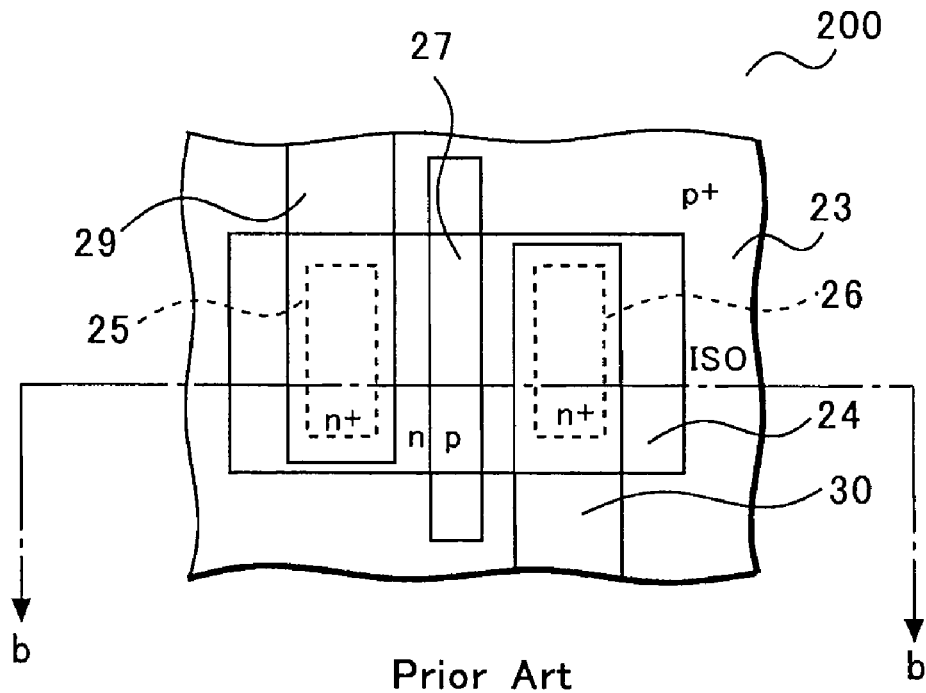
FIG. 8A is a plan view.
Figure 8B:
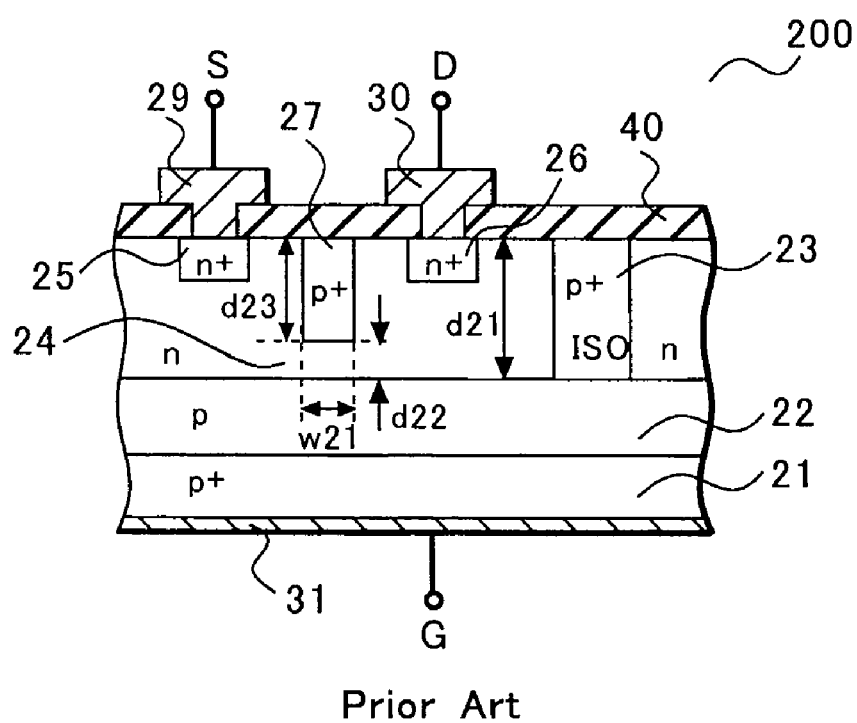
FIG. 8B is a cross-sectional view, of a conventional semiconductor device.
Figure 9A:
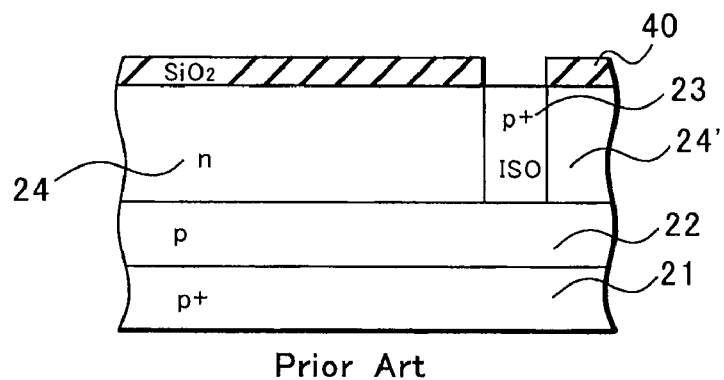
FIG. 9A to FIG. 9D are cross-sectional views for describing a conventional method of manufacturing a semiconductor device.
Figure 9B:
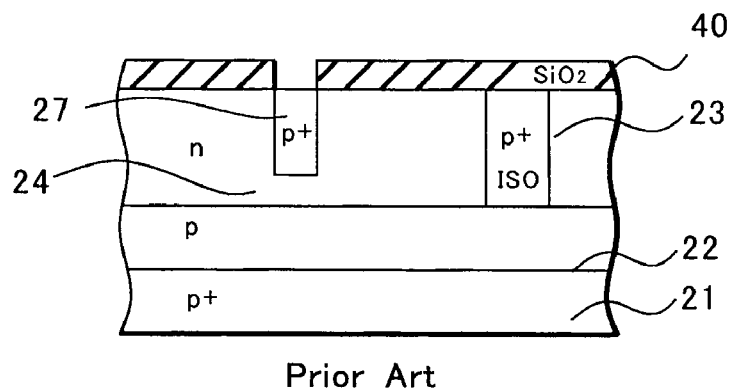
Figure 9C:
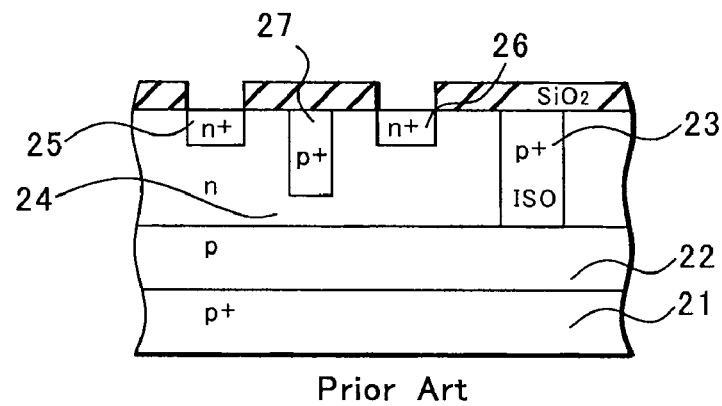
Figure 9D:
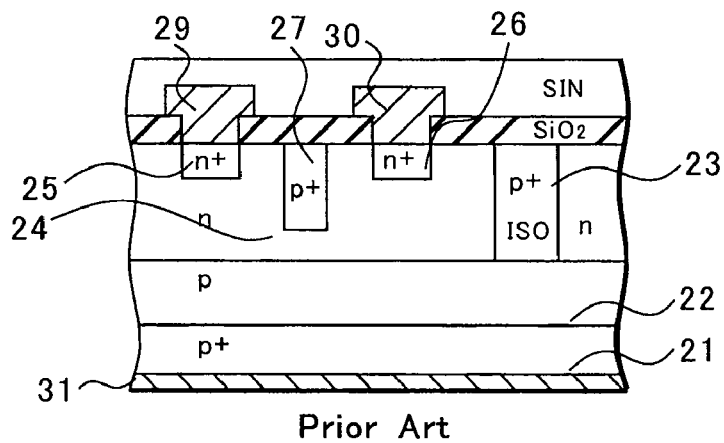

In the present embodiment, an drain-source saturation current I$_{DSS}$ (or a pinch-off voltage) substantially equal to that of the junction FET 200 in the conventional structure shown in FIG. 8 is maintained, and a gate length w11 and a depth d12 of the region immediately below the gate region 7 are respectively set to be substantially equal to those in the conventional structure (w11=w21, d12=d22). Moreover, the impurity concentration of the channel region 3 is also set to be substantially equal to that in the conventional structure.

The gate region 7 comes into contact with the conductive layer 8 formed thereon. The conductive layer 8 is a polysilicon layer containing p type impurities, and can reduce the gate resistance. The gate resistance is an input resistance, and has a large influence on the noise figure characteristic and the distortion characteristic of the junction FET. According to the present embodiment, the noise figure characteristic and the distortion characteristic can be improved with the reduction in the gate resistance. Specifically, in order to reduce the gate resistance, it is desirable that the large cross-sectional area of the conductive layer 8 is secured. On the other hand, the capacitance of the gate region 7 needs to be reduced. For this reason, the conductive layer 8 is formed so that a width w12 of the top surface thereof is larger than the width (gate length) w11 of the portion contacting with the gate region 7.

The conductive layer 8 elongates to the surface of the p type semiconductor layer 2 outside the channel region 3 (see FIG. 1A), and a gate electrode 13 is formed on the back surface of the p+ type semiconductor substrate 1. The gate region 7 is electrically connected to the gate electrode 13 via the conductive layer 8, the p type semiconductor layer 2 and the p+ type semiconductor substrate 1.

In the present embodiment, the channel region 3 is formed into an island shape by ion implantation and diffusion in the surface of the p type semiconductor layer 2. In other words, the channel region 3 can be formed in a way that the depth d11 of the channel region 3 from the surface of the p type semiconductor layer 2 is shallow. In the present embodiment, the depth d11 of the channel region 3 is, for example, 0.9 μm. Consequently, with the structure according to the embodiment, the area of the pn junctions can be reduced, and thereby the pn junction capacitance can be reduced, as compared to the conventional structure (FIG. 8) where the depth d21 of the channel region 24 is approximately 2 μm.

Here, a cut-off frequency f$_T$ indicating the high frequency characteristic of the junction FET is expressed by the following formula.

$$f_T = gm/(2\pi C_G)$$

In the above formula, gm is the mutual conductance, and C$_G$ is the sum of the gate-source junction capacitance C$_{GS}$ and the gate-drain junction capacitance C$_{GD}$. Hence, the gate junction capacitance C$_G$, which is the sum of the gate-source junction capacitance C$_{GS}$ and the gate-drain junction capacitance C$_{GD}$, has a large influence on the high frequency characteristic of the junction FET 100.

In the channel region 3, the source region 5 and the drain region 6 having the same conductivity type as that of the channel region 3 are formed, and the channel region 3 is connected to these regions. In addition, the p type semiconductor layer 2 and the p+ type semiconductor substrate 1 are electrically connected to the gate region 7 via the conductive layer 8. Thus, the reduction in the pn junction capacitance of the junctions between the gate region 7 (the semiconductor layer 2) and the channel region 3 results in the reduction in the gate-source junction capacitance C$_{GS}$ and the gate-drain junction capacitance C$_{GD}$. Thereby, because of the reduction in the total capacitance (the gate capacitance C$_G$), the high frequency characteristic of the junction FET 100 can be improved.

In the conventional structure, the area of the pn junctions formed between the channel region 24 and the p type epitaxial layer 22 and between the channel region 24 and the p+ type isolation region 23 is restricted by the thickness d21 of the n type epitaxial layer 24' (depth of the channel region 24). As a result, the improvement in the high frequency characteristic of a junction FET having the conventional structure by the reduction in the pn junction capacitance has not been achieved.

In contrast, according to the present embodiment, by forming the channel region 3 by ion implantation, the depth d11 thereof can be made sufficiently shallow. This allows the reduction in the area of the pn junctions. Thus, the reduction in the pn junction capacitance makes it possible to increase the cut-off frequency f$_T$. To be more specific, the cut-off frequency f$_T$ which is 560 MHz in the conventional structure is increased to 750 MHz according to the present embodiment.

Hereinafter, description will be given of the reduction in the noise figure (NF) characteristic of the junction FET 100, which can also be made possible according to the present embodiment.

Firstly, the edges (the side surfaces and the bottom surface) of the channel region 3 form the pn junctions together with the p type semiconductor layer 2. Specifically, as compared to the conventional structure, shown in FIG. 8, where the pn junctions are formed between the isolation region 23, which is the high impurity concentration region (approximately 1E19 cm$^{-3}$), and the channel region 24, the difference in impurity concentration at the pn junctions between the side surfaces of the channel region 3 and the p type semiconductor layer 2 can be reduced. The reduction in the impurity concentration difference allows the depletion layer in the pn junction regions at an early stage to spread, and thus, the pn junction capacitance can be reduced. As a result, a leakage current $I_{GSS}$ can be reduced on each side surface of the channel region 3.

Next, as described above, the $I_{DSS}$ (or pinch-off voltage) of the junction FET 100 is determined by the following factors: the depth d12 of the region immediately below the gate region 7; the impurity concentration of the channel region 3; and the width of the gate region 7 (the gate length w11).

In the present embodiment, for the comparison, the $I_{DSS}$ (or pinch-off voltage) substantially equal to that of the junction FET 200 in the conventional structure shown in FIG. 8 is maintained, and the gate length w11 and the depth d12 of the region immediately below the gate region 7 are respectively set to be the values substantially equal to those in the conventional structure (w11=w21, d12=d22). Moreover, the impurity concentration of the channel region 3 is also set to be the values substantially equal to that in the conventional structure.

Specifically, when the depth d12 of the region immediately below the gate region 7, substantially equal to the depth d22 in the conventional structure, is maintained (for example, 0.7 μm to 0.8 μm), and concurrently when the depth d11 of the channel region 3 is formed shallower than the depth d21 in the conventional structure, the depth d13 of the gate region 7 can be formed shallower than the depth d23 of the conventional gate region 27.

Accordingly, the length of a signal path of the junction FET 100, which passes through from the source region 5 to the drain region 6 via a region below the gate region 7 can be reduced, as compared to that of the signal path in the conventional structure. As a result, an internal resistance R in the channel region 3 can be reduced.

Furthermore, the lateral diffusion (diffusion in a horizontal direction of the substrate 10) progresses in accordance with the depth of the diffusion region. Thus, when the depth of the gate region 7 is shallow, the progress of the lateral diffusion can also be suppressed. As a result, the distance between the source region 5 and the drain region 6 can be reduced. This contributes to both the increase in the cell density and the reduction in the length of the signal path, which also makes it possible to reduce the internal resistance R in the channel region 3.

Still furthermore, the gate region 7 comes into contact with the conductive layer 8 formed thereon. The gate resistance can be reduced by the conductive layer 8. Since the gate resistance has an influence on, for example, the noise figure characteristic of the junction FET 100 and the distortion characteristic of the input signals, these characteristics can be improved by the reduction in the gate resistance.

Figure 2:
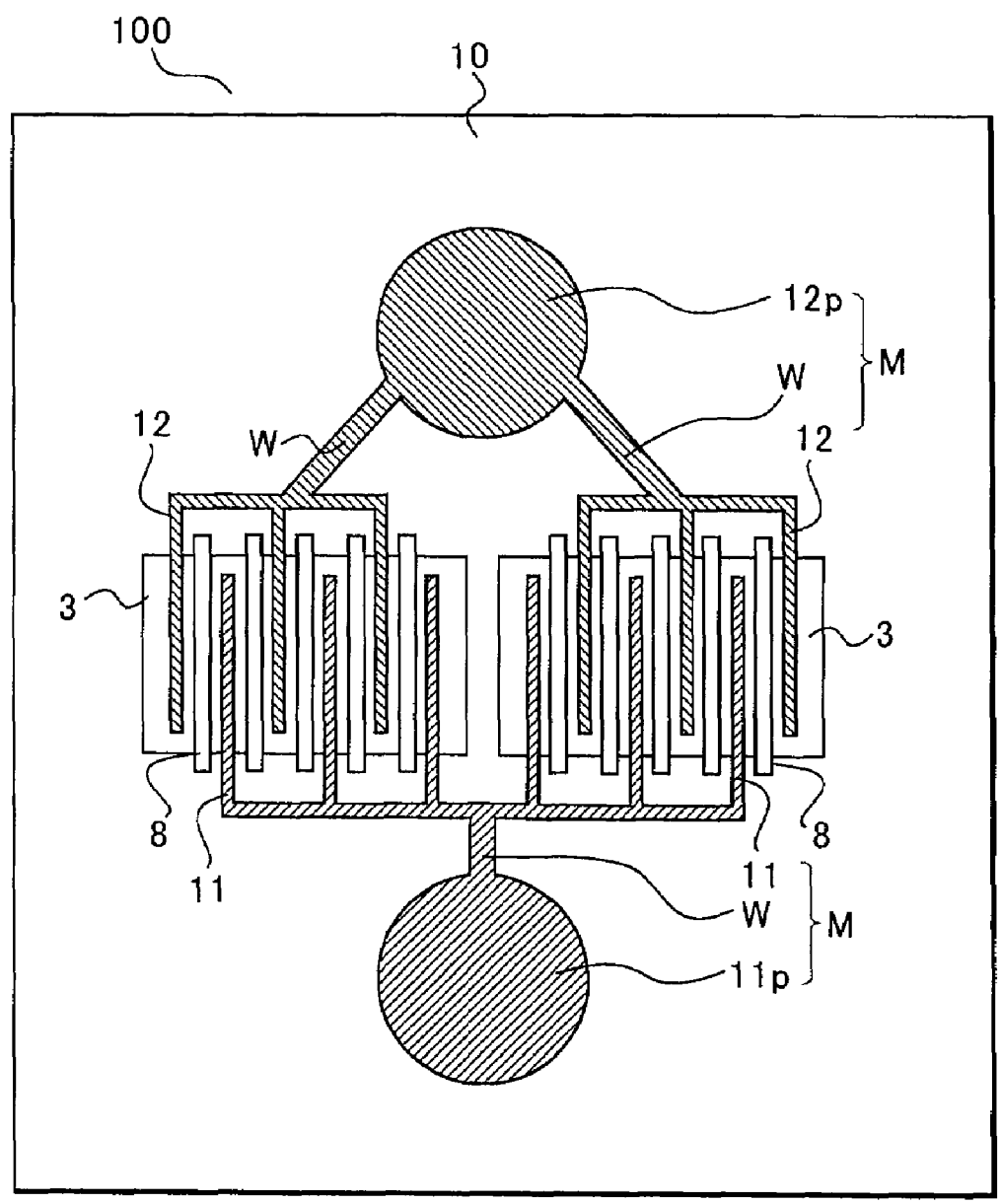
FIG. 2 is a plan view for describing the semiconductor device according to the embodiment of the present invention.
Figure 3:
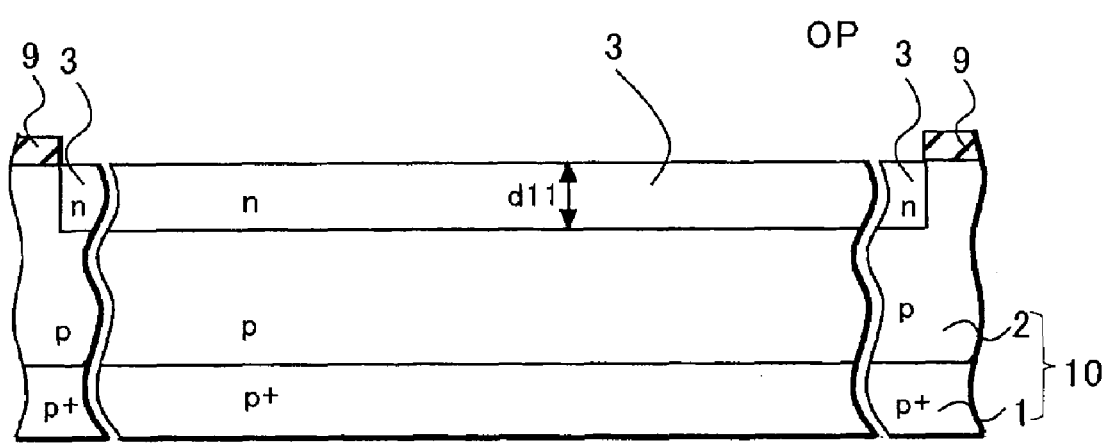
FIG. 3 is a cross-sectional view for describing a method of manufacturing a semiconductor device according to an embodiment of the present invention.

FIG. 2 is a plan view showing one example of wirings according to the present embodiment.

Here, two of the channel regions 3 shown in FIG. 1A and FIG. 1B are disposed, and the channel regions 3 are connected in parallel to each other with metal electrode layers M. However, one continuous channel region 3 may be disposed instead.

The source electrodes 11 and the drain electrodes 12 are formed on each of the channel regions 3, so that the source electrodes 11 and the drain electrodes 12 overlap, and are connected to, the source regions and the drain regions, respectively. The source electrodes 11 and the drain electrodes 12 are disposed into an engaged-comb shape. The source electrodes 11 are connected to a source pad electrode 11p with one wiring W, and the drain electrodes 12 are connected to a drain pad electrode 12p with two wirings W extended from the respective channel regions 3.

The gate regions are connected to a gate electrode (not illustrated) formed on the back surface of the p type semiconductor substrate 10 via the conductive layer 8 and the p type semiconductor substrate 10.

Next, description will be given of a method of manufacturing a junction FET according to the present invention with reference to FIGS. 3 to 7.

First step (FIG. 3) of: forming semiconductor layer of one conductivity type on semiconductor substrate of one conductivity type; implanting ions of impurity of opposite conductivity type in surface of semiconductor layer of one conductive type to form channel region of opposite conductivity type into an island shape, edges of which region form pn junctions together with semiconductor layer of one conductive type.

A p type semiconductor layer 2 is stacked on a p+ type semiconductor substrate 1, for example, by epitaxial growth to prepare a semiconductor substrate 10. An insulating film (for example, an oxide film) 9 is formed on the surface of the p type semiconductor layer 2. Then, an opening is formed in a predetermined position of the insulating film 9, and ion implantation and diffusion of an n type impurity are selectively performed in the opening. The impurity is for example phosphorus (P+). The implantation conditions are a dose of $5E12$ cm$^{-2}$ to $2E13$ cm$^{-2}$ and an acceleration energy of 140 KeV. The diffusion conditions are a temperature of 1100° C. and a time of 200 minutes to 300 minutes. Under these conditions, a channel region 3 is formed into an island shape so that a depth d11 of the channel region 3 from the surface of the p type semiconductor layer 2 is approximately 0.8 μm to 1.5 μm (for example, 0.9 μm). Edges (side surfaces and bottom surface) of the channel region 3 form pn junctions together with the p type semiconductor layer 2.

Second step (FIG. 4A and FIG. 4B) of performing ion implantation of impurity of one conductivity type in surface of channel region.

Figure 4A:
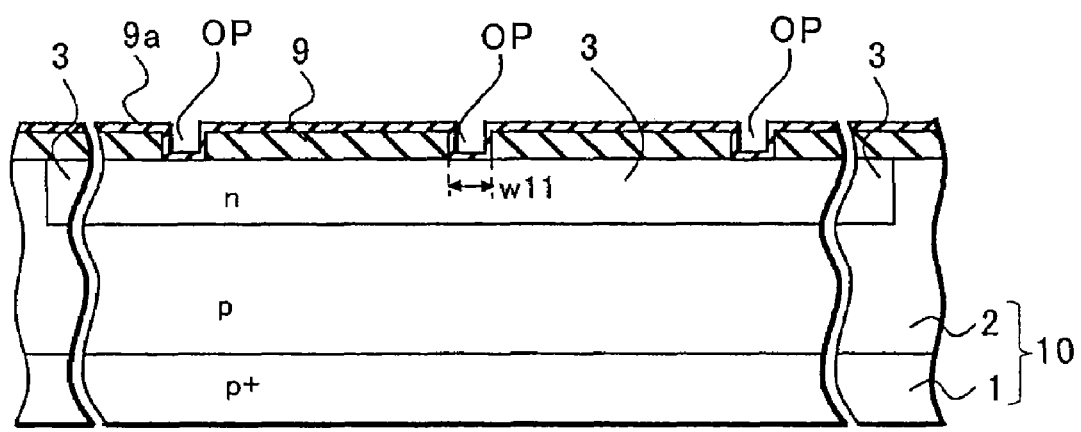
FIG. 4A and FIG. 4B are cross-sectional views for describing the method of manufacturing a semiconductor device according to the embodiment of the present invention.

The insulating film (oxide film) 9 is again formed on the entire surface of the resultant substrate with a thickness of approximately 4000 Å. Then, openings OP are formed in regions where gate regions are to be formed. A width w11 of each opening OP is the gate length. Subsequently, an additional insulating film (oxide film) 9a is formed on the entire surface of the resultant substrate with a thickness of approximately 500 Å. The insulating film 9a serves as a mask for making an average projected range of the ion implantation in the gate region shallow (FIG. 4A).

Next, a mask which exposes only the openings OP is formed by a photoresist PR.

Figure 4B:
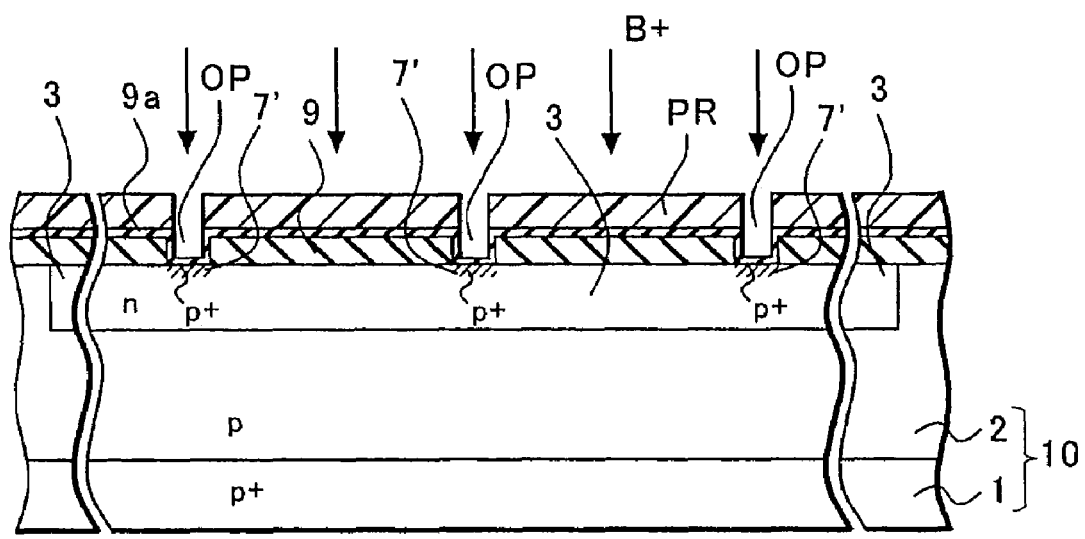

Ion implantation of a p type impurity is performed on the entire surface of the substrate. An example of the ions for the implantation is boron (B+). The acceleration energy is approximately 80 KeV, and the dose is approximately $1E14$ cm$^{-2}$. The ions are implanted in sufficiently shallow regions through the insulating film 9a with a thickness of approximately 500 Å in which the openings OP are formed. Thereby, p type gate-impurity implantation regions 7' are formed (FIG. 4B).

Third step (FIG. 5A and FIG. 5B) of forming conductive layer on surface of channel region.

Figure 5A:
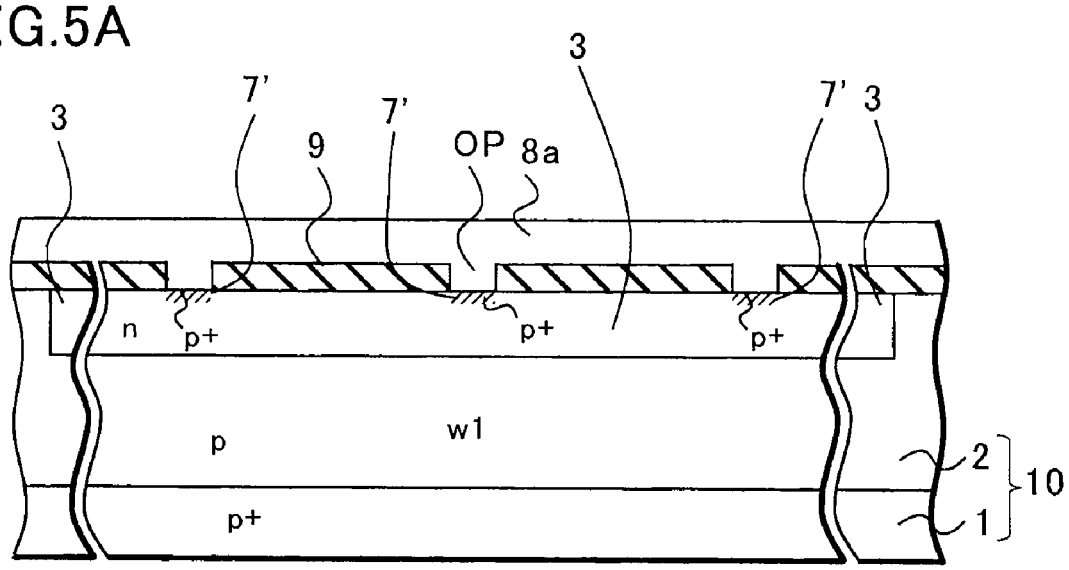
FIG. 5A and FIG. 5B are cross-sectional views for describing the method of manufacturing a semiconductor device according to the embodiment of the present invention.

The photoresist PR and the insulating film 9a are removed. A polysilicon layer 8a (thickness of 2000 Å) is deposited on the entirely exposed insulating film 9. Impurities (of boron (B+) with a dose of $7E15$ cm$^{-2}$) are doped (with acceleration energy of 30 KeV) into the polysilicon layer 8a so as to reduce the gate resistance. The polysilicon layer 8a comes into contact with the gate-impurity implantation regions 7' through the openings OP (FIG. 5A).

Subsequently, a mask with a desired pattern is formed thereon, and the polysilicon layer 8a is patterned to form conductive layers 8, each having a width w12 (for example, 4 μm) of the top surface larger than a width w11 (for example, 1 μm) of the bottom surface.

Figure 5B:
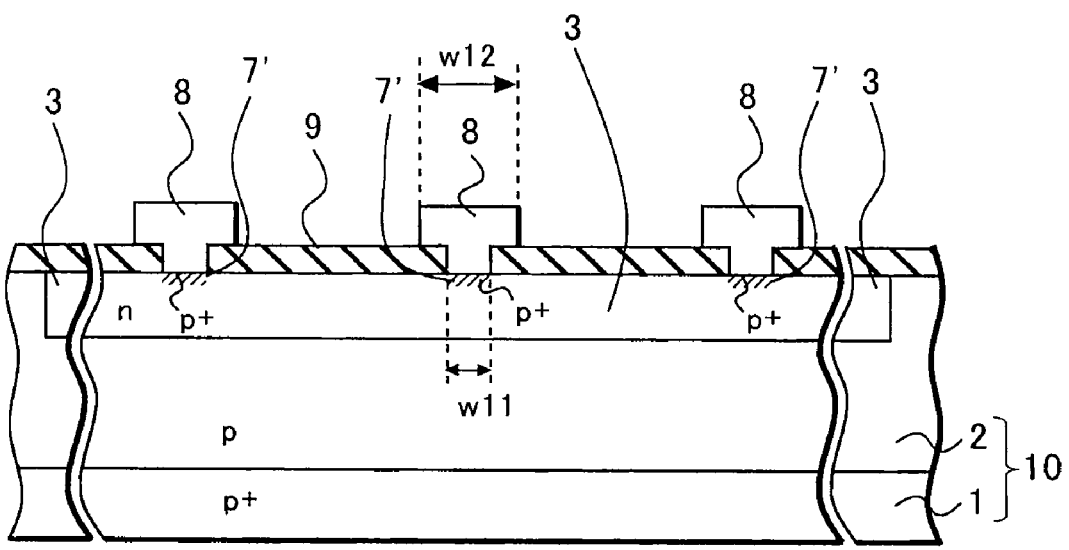

The conductive layers 8 serve as connection for connecting the gate regions and a gate electrode to be formed in the below-described steps to contribute to the reduction in the gate resistance. For the reduction in the gate capacitance, the gate length (the width of the bottom surface of the conductive layer 8) w11 is desired to be small. On the other hand, the cross-sectional area of the conductive layer 8 is desired to be large for the reduction in the gate resistance. Therefore, the width w12 of the top surface of each of the conductive layers is formed to be larger than the width w11 of the bottom surface (FIG. 5B).

Fourth step (FIG. 6A and FIG. 6B) of: forming gate region of one conductivity type in surface of channel region; and forming source region and drain region of opposite conductivity type in surface of channel region.

Figure 6A:
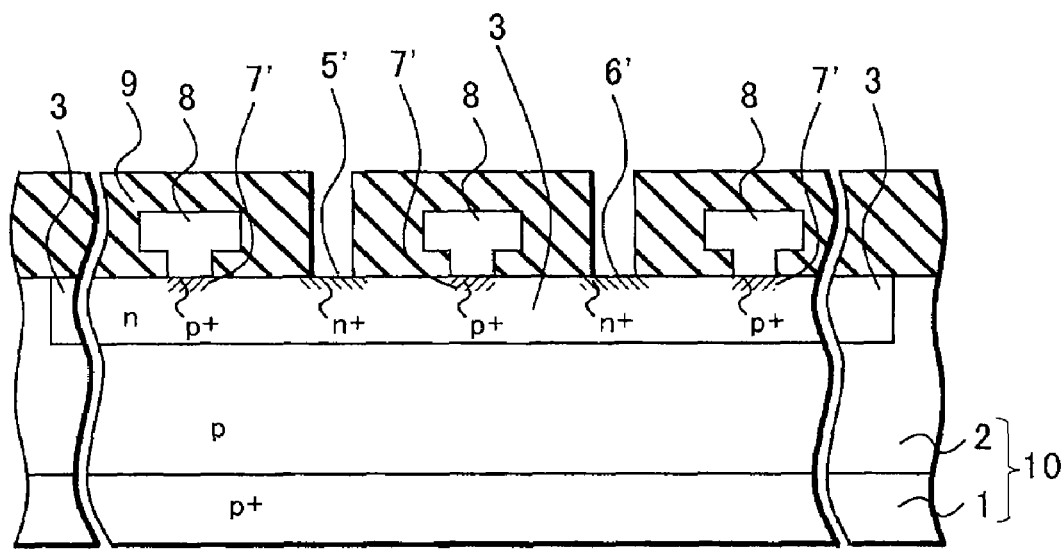
FIG. 6A and FIG. 6B are cross-sectional views for describing the method of manufacturing a semiconductor device according to the embodiment of the present invention.

The insulating film 9 is again formed on the entire surface of the resultant substrate, and openings are formed in regions of the insulating film 9 where the source region and the drain region are to be formed. Ion implantation of an n type impurity (with a dose of 5 E 15 cm$^{-2}$, an acceleration energy of 20 KeV) is performed in the entire surface of the opening to form a source-impurity implantation region 5' and a drain-impurity implantation region 6' (FIG. 6A).

Subsequently, a heat treatment is performed (at the temperature of approximately 950° C. for 20 minutes). Thereby, the n type impurities in the source-impurity implantation region 5' and the drain-impurity implantation region 6' are diffused into the channel region 3 to form the source region 5 and the drain region 6. Moreover, the impurities in the gate-impurity implantation regions 7' are diffused at the same time. Accordingly, the gate regions 7 are formed below the conductive layers 8, and come into contact with the conductive layers 8. A depth d13 of the gate region 7 from the surface of the channel region 3 is 0.1 μm to 0.2 μm. A depth d12 of the region immediately below the gate region 7, which determines an $I_{DSS}$ (or pinch-off voltage), is 0.7 μm to 0.8 μm.

As described above, since the diffusion takes place in a shallow region to form the gate region 7, the heat treatment time is reduced as compared to that in the conventional structure. For example, in the conventional structure shown in FIG. 8, the heat treatment time for forming the gate region 27 is one hour. In contrast, according to the present embodiment, the heat treatment is performed for ⅓ (approximately 20 minutes) of the time required in the conventional structure. Moreover, the reduction in the heat treatment time makes it possible to suppress the lateral diffusion.

Figure 6B:
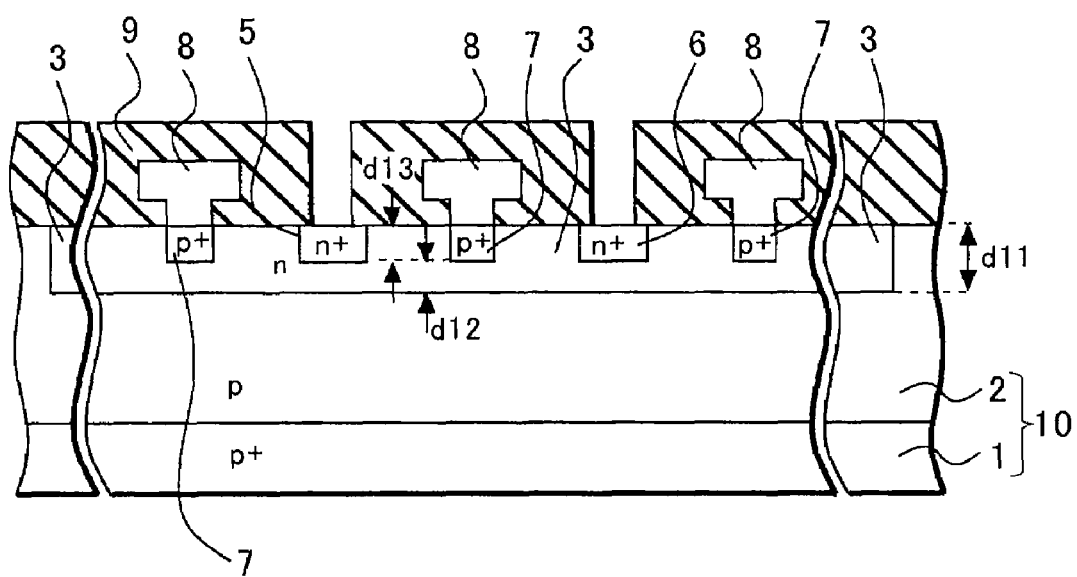
Figure 7:
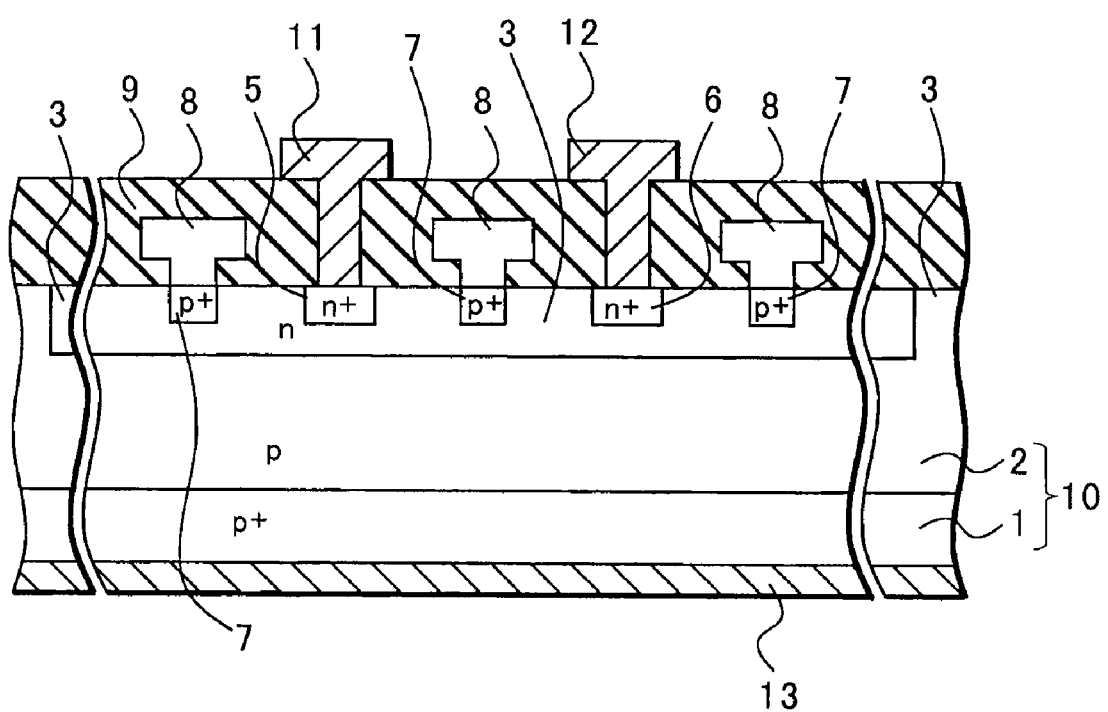
FIG. 7 is a cross-sectional view for describing the method of manufacturing a semiconductor device according to the embodiment of the present invention.

The source region 5, the drain region 6 and the gate regions 7 are each formed with a depth shallower than that of the channel region 3, and formed in approximately the same depth (FIG. 6B).

Fifth step (FIG. 7) of forming electrodes connected to corresponding regions.

While the insulating film 9 is left on the surface of the substrate, a metal, such as Al, is vacuum-evaporated. Then, the resultant substrate is patterned into a predetermined electrode structure. Thereby, a source electrode 11 and a drain electrode 12 are formed so that the source electrode 11 and the drain electrode 12 come into contact with the source region 5 and the drain region 6, respectively. Moreover, the gate electrode 13 is formed on the back surface of the substrate. The gate electrode 13 is connected to the gate electrodes 7 via the p+ type semiconductor substrate 1, the p type semiconductor layer 2 and the conductive layers 8.

According to the present invention, the following effects are obtained.

Firstly, by forming the channel region by ion implantation, the depth d11 of the channel region can be made shallow. This makes it possible to reduce the area of the pn junctions between the gate region (p type semiconductor layer) and the channel region, as compared to that in the conventional structure. Thereby, the cut-off frequency $f_T$ can be improved. As a result, the improvement in the high frequency characteristic of the junction FET can be achieved.

Secondly, the channel region forms the pn junctions together with the p type semiconductor layer having a lower impurity concentration than that in the conventional structure. Thus, the difference in impurity concentration at the pn junctions between the p type region (p type semiconductor layer) and the edges (side surfaces) of the channel region can be reduced, as compared to the conventional structure (FIG. 8) where the pn junctions are formed between the isolation region, which is a high p type impurity concentration region, and the channel region (well region). By reducing the impurity concentration difference at the pn junctions, the leakage current $I_{GSS}$ can be reduced on each edge of the channel region.

Thirdly, compared to the conventional structure, the gate region can be made shallow in accordance with the channel region formed shallow. In other words, in order to maintain the $I_{DSS}$ substantially equal to that in the conventional structure, in a case where the depth of the region immediately below the gate region is set to be substantially equal to that in the conventional structure, the gate region can be made shallow by the reduced amount of the depth of the channel region.

By having the shallow gate region, the signal path passing through from the source region to the drain region via the region below the gate region can be reduced. As a result, the internal resistance in the gate region can be reduced, and thereby, the noise figure characteristic can be improved.

Moreover, when the diffusion depth of the gate region is shallow, the lateral diffusion in the gate region is also reduced. Thus, the distance between the source region and the gate region as well as the distance between the drain region and the gate region can be reduced. As a result, the signal path can be further reduced, contributing to the improvement in the noise figure characteristic of the junction FET.

Fourthly, by forming the conductive layer which comes into contact with the gate region, the gate resistance can be reduced. The gate resistance is an input resistance, and has a large influence on the noise figure characteristic and the distortion characteristic of the junction FET. According to the present invention, the noise figure characteristic and the distortion characteristic can be improved with the reduction in the gate resistance.

Fifthly, since the epitaxial layer serving as the channel region does not need to be laminated, the cost for wafering is reduced.

According to the manufacturing method of the present invention, firstly, the step of forming an isolation region can be omitted. Specifically, since the channel region is formed in the p type semiconductor layer by ion implantation, the step of forming the p+ type isolation region is no longer necessary, the step having been necessary to isolate the n type epitaxial layer in the conventional manufacturing method. The isolation region forming step in the conventional manufacturing method is a separate step from the step of forming, for example, the gate region. Thus, by making this step unnecessary, the whole manufacturing steps can be simplified.

Secondly, the gate region, which is an impurity diffusion region, can be made shallow. In the conventional manufacturing method, the gate region needs to be formed deeply in accordance with the depth of the channel region. Consequently, long heat treatment time is required. In contrast, according to the present invention, the heat treatment time for forming the gate region can be shortened to, for example, ⅓ of the time required in the conventional manufacturing method.

What is claimed is:

1. A junction field effect transistor comprising:
    a semiconductor substrate of a first general conductivity type;
    a semiconductor layer of the first general conductivity type disposed on the substrate;
    a channel region of a second general conductivity type, the channel region being formed in a surface portion of the semiconductor layer so that a lateral edge of the channel region forms a pn junction with the semiconductor layer;
    a source region of the second general conductivity type formed in the channel region;
    a drain region of the second general conductivity type formed in the channel region;
    a gate region of the first general conductivity type formed in the channel region;
    a conductive layer disposed on the gate region so as to be in contact with the gate region and comprising polysilicon containing an impurity; and
    an insulating film disposed on the semiconductor layer so as to cover the entire top surface of the conductive layer.

2. The transistor of claim 1, wherein depths of the source, drain and gate regions in the channel region are substantially equal.

3. A junction field effect transistor comprising:
    a semiconductor substrate of a first general conductivity type;
    a semiconductor layer of the first general conductivity type disposed on the substrate;
    a channel region of a second general conductivity type, the channel region being formed in a surface portion of the semiconductor layer so that a contour of the channel region is within a contour of the semiconductor layer and a lateral edge of the channel region forms a pn junction with the semiconductor layer;
    a source region of the second general conductivity type formed in the channel region, an impurity concentration of the source region being higher than an impurity concentration of the channel region;
    a drain region of the second general conductivity type formed in the channel region, an impurity concentration of the drain region being higher than the impurity concentration of the channel region;
    a gate region of the first general conductivity type formed in the channel region;
    a conductive layer disposed on the gate region so as to be in contact with the gate region and comprising polysilicon containing an impurity; and
    an insulating film disposed on the semiconductor layer so as to cover the entire top surface of the conductive layer.

4. The transistor of claim 3, wherein a top portion of the conductive layer is wider than a bottom portion of the conductive layer that is in contact with the gate region.

5. The transistor of claim 3, wherein depths of the source, drain and gate regions in the channel region are equal.

6. A method of manufacturing a junction field effect transistor, comprising:
    forming a semiconductor layer of a first general conductivity type on a semiconductor substrate of the first general conductivity type;
    implanting impurity ions in the semiconductor layer to form a channel region of a second general conductivity type so that a lateral edge of the channel region forms a pn junction with the semiconductor layer;
    forming a conductive layer on the channel region by depositing polysilicon containing an impurity;
    forming a gate region of the first general conductivity type in the channel region;
    forming a source region and a drain region that are of the second general conductivity type in the channel region;
    forming an insulating film disposed on the semiconductor layer; and
    forming a source electrode on the source region and a drain electrode on the drain region,
    wherein the insulating film is formed so that the insulating film covers the entire top surface of the conductive layer, and the source and drain electrodes penetrate through the insulating film so as to be exposed at a top surface of the insulating film.

7. A method of manufacturing a junction field effect transistor, comprising:
    forming a semiconductor layer of a first general conductivity type on a semiconductor substrate of the first general conductivity type;
    implanting impurity ions in an isolated area of the semiconductor layer to form a channel region of a second general conductivity type;
    forming a conductive layer on the channel region by depositing polysilicon containing an impurity;
    forming a gate region of the first general conductivity type in the channel region;
    forming a source region and a drain region that are of the second general conductivity type in the channel region
    forming an insulating film disposed on the semiconductor layer; and
    forming a source electrode on the source region and a drain electrode on the drain region,
    wherein the insulating film is formed so that the insulating film covers the entire top surface of the conductive layer, and the source and drain electrodes penetrate through the insulating film so as to be exposed at a top surface of the insulating film.

8. The method of claim 7, wherein the formation of the gate region and the formation of the source and drain regions comprise implantation of corresponding impurity ions, and the impurity ions for the gate, source and drain regions are diffused in the same heat treatment.

9. The transistor of claim 1, wherein in plan view of the transistor the conductive layer extends outside the channel region.

10. The transistor of claim 3, wherein in plan view of the transistor the conductive layer extends outside the channel region.

* * * * *